United States Patent
Zhou et al.

(10) Patent No.: US 7,112,964 B2
(45) Date of Patent: Sep. 26, 2006

(54) EDDY CURRENT MEASUREMENT AND CORRECTION IN MAGNETIC RESONANCE IMAGING SYSTEMS WITH A STATIC PHANTOM

(75) Inventors: Yong Zhou, Waukesha, WI (US); Kevin Franklin King, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 147 days.

(21) Appl. No.: 10/909,447

(22) Filed: Aug. 2, 2004

(65) Prior Publication Data
US 2006/0022674 A1 Feb. 2, 2006

(51) Int. Cl.
*G01V 3/00* (2006.01)

(52) U.S. Cl. .................................................. 324/307
(58) Field of Classification Search .................. None
See application file for complete search history.

(56) References Cited

U.S. PATENT DOCUMENTS

| | | | |
|---|---|---|---|
| 4,818,942 A | 4/1989 | Rzedzian | |
| 4,885,542 A | 12/1989 | Yao et al. | |
| 4,910,460 A | 3/1990 | Sebok | |
| 4,940,941 A | 7/1990 | Rzedzian | |
| 5,122,748 A * | 6/1992 | Oh et al. | 324/309 |
| 5,345,178 A * | 9/1994 | Manabe et al. | 324/320 |
| 5,391,990 A * | 2/1995 | Schmitt et al. | 324/320 |
| 5,450,010 A | 9/1995 | Van Der Meulen et al. | |
| 5,455,512 A | 10/1995 | Groen et al. | |
| 5,497,773 A | 3/1996 | Kuhara et al. | |
| 5,581,181 A | 12/1996 | Fuderer | |
| 5,592,091 A * | 1/1997 | Manabe | 324/320 |
| 5,722,409 A | 3/1998 | Kuhara et al. | |
| 5,856,744 A | 1/1999 | Block et al. | |
| 5,864,233 A * | 1/1999 | Zhou et al. | 324/309 |
| 5,942,897 A | 8/1999 | Kanazawa | |
| 6,144,202 A | 11/2000 | Kanazawa et al. | |
| 6,160,397 A | 12/2000 | Washburn et al. | |
| 6,239,599 B1 | 5/2001 | Zhou et al. | |
| 6,275,038 B1 * | 8/2001 | Harvey | 324/309 |
| 6,275,040 B1 | 8/2001 | Zur | |

(Continued)

OTHER PUBLICATIONS

M. T. Alley, A. R. Pineda, R. Bammer, M. Markl, N. J. Pelic, A Method for MR Eddy Current Characterizations and Compensation, Proc. Intl. Mag. Reson. Med., 11 (2003).

*Primary Examiner*—Diego Gutierrez
*Assistant Examiner*—Tiffany A. Fetzner
(74) *Attorney, Agent, or Firm*—Carl B. Horton, Esq.; Armstrong Teasdale LLP

(57) ABSTRACT

A method of measuring and correcting eddy currents in a MRI system includes running a pulse sequence using bipolar gradient pulses and a first delay Te, to acquire a phase-difference image and a phase response of a static phantom that fills a majority of a field of view (FOV) of the MRI system, fitting the phase difference image to a two-dimensional second order polynomial, and changing the pulse sequence to provide a different delay. The method includes iterating running a pulse sequence and fitting the phase difference image and phase response with different delays to determine coefficients of the second order polynomial and a time constant of the phase response, correcting a pre-emphasis eddy current correction (ECC) system of the MRI system in accordance with the time constant of the phase response, determining an amplitude correction to reduce determined coefficients, and storing determined amplitude corrections in the pre-emphasis ECC system.

24 Claims, 6 Drawing Sheets

U.S. PATENT DOCUMENTS

| | | | |
|---|---|---|---|
| 6,288,545 B1 * | 9/2001 | King et al. | 324/318 |
| 6,323,646 B1 | 11/2001 | Zhou et al. | |
| 6,331,777 B1 | 12/2001 | Van Den Brink et al. | |
| 6,448,773 B1 * | 9/2002 | Zhang | 324/309 |
| 6,469,505 B1 | 10/2002 | Maier et al. | |
| 6,528,998 B1 * | 3/2003 | Zhou et al. | 324/309 |
| 6,700,374 B1 * | 3/2004 | Wu et al. | 324/312 |
| 6,903,550 B1 * | 6/2005 | Uetake | 324/307 |
| 6,933,720 B1 * | 8/2005 | Zhang | 324/309 |
| 2003/0109781 A1 * | 6/2003 | Zhang | 600/410 |

* cited by examiner

EDDY CURRENT MEASUREMENT AND CORRECTION IN MAGNETIC RESONANCE IMAGING SYSTEMS WITH A STATIC PHANTOM

BACKGROUND OF THE INVENTION

This invention relates generally to magnetic resonance imaging (MRI) systems, and more particularly to methods for compensating for eddy currents existing in MRI systems.

Eddy currents are electric currents generated in a conducting structure by rapidly changing magnetic fields. In modern MRI systems, a fast switching gradient subsystem and a conducting (typically metallic) structure of the MRI scanner couple together and generate substantial eddy currents that can lead to image artifacts or distortion. At least one known superconducting MRI system is equipped with a pre-emphasis system that compensates for the eddy current effect. However, image distortion resulting from overcompensation and undercompensation can still occur. At least one known method for eddy current measurement based on the Free Induction Decay (FID) techniques is known not to be very sensitive to currents with short time constants on the order of 1 to 4 ms.

Recent reports suggest that flow-quantization using Phase Contrast (PC) imaging has worse performance on contemporary scanners than on previous generation scanners that have slower gradients. This phenomenon has been noted on scanners made by a number of different manufacturers.

Phase contrast imaging uses a bipolar gradient to encode flowing spin. For each set of k-space data, there are usually two acquisitions. In a first acquisition, a flow sensitizing bipolar gradient is turned on. In a second acquisition, the bipolar gradient is either turned off or reversed in polarity. The phase difference image reconstructed from these two sets of data is used to represent the flow. It is known that the flow velocity is proportional to the phase difference:

$$v = \frac{v_{enc}\Delta\varphi}{\pi}$$

in which $v_{enc}$ is the velocity which will lead to phase shift of $\pi$.

However, if there is uncompensated eddy current, there will be different amount of extra phase accumulation during the two acquisitions. Thus, a spurious extra phase difference is displayed in the phase difference image because the eddy current effects are different in these two acquisitions. As a result of the spurious phase difference, there is also an error in flow or velocity measurement. These effects can lead to an overall phase shift in an entire object or a phase ramp throughout an object. The overall phase shift or phase ramp are caused by B0 eddy currents (DC) and linear eddy currents, respectively. On a scanner with a high slew-rate gradient system used in applications such as the quantification of aortic flow, the amount of error can be on the order of the quantity being measured.

BRIEF DESCRIPTION OF THE INVENTION

In some aspects, the present invention therefore provides a method for measuring and correcting for eddy currents in a magnetic resonance imaging system. The method includes turning at least a portion of a pre-emphasis eddy current correction system of the magnetic resonance imaging system off and running a pulse sequence using bipolar gradient pulses to acquire a phase-difference image and a phase response of a static phantom that fills a majority of a field of view (FOV) of the magnetic resonance imaging system, where running also includes running the pulse sequence to provide a first delay Te. The method further includes fitting the phase difference image to a two-dimensional second order polynomial, changing the pulse sequence to provide a different delay, and iterating the running a pulse sequence and fitting the phase difference image and phase response a plurality of times with different delays to determine coefficients of the second order polynomial and a time constant of the phase response. The method also includes correcting the pre-emphasis eddy current correction system in accordance with the time constant of the phase response; determining an amplitude of correction to reduce the determined coefficients and storing the determined amplitude corrections in the pre-emphasis eddy current correction system.

In yet other aspects, the present invention provides a method for measuring and correcting for eddy currents in a magnetic resonance imaging system. In these aspects, the method includes running a pulse sequence using bipolar gradient pulses to acquire a phase-difference image and a phase response of a static phantom that fills a majority of a field of a view (FOV) of the magnetic resonance imaging system, where running also includes running the pulse sequence to provide a first delay Te, fitting the phase difference image to a two-dimensional second order polynominal, and changing the pulse sequence to provide a different delay. The method further includes itertaing the running a pulse sequence and fitting the phase difference image and phase response with different delays to determine coefficients of the second order polynominal and a tome constant of the phase response. The method also inlcudes correcting a pre-emphasis eddy current correction system of the magnetic resonance imaging system in accordance with the time constant of the phase response, determing an amplitude of correction to reduce the determined coefficients, and storing the determined amplitude corrections in the pre-emphasis eddy current correction system.

In other aspects, the present invention provides a method for measuring and correcting for eddy currents in a magnetic resonance imaging system. The method includes turning off short time constant pre-emphasis corrections of the magnetic resonance imaging system, including time constants between 1 and 20 ms and running a pulse sequence using bipolar gradient pulses to acquire a phase-difference image and a phase response of a static phantom that fills a majority of a field of view (FOV) of the magnetic resonance imaging system, where running also includes running the pulse sequence to provide a first delay Te. The method also includes fitting the phase difference image to a two dimensional second order polynomial $\phi(x,y)$ written $\phi(x,y)=a+b\cdot x+c\cdot y+d\cdot x^2+e\cdot y^2+f\cdot x\cdot y$, where x and y correspond to two dimensions of the acquired image, and a, b, c, d, e, and f are coefficients to be fitted, and changing the pulse sequence to provide a different delay. The method also includes iterating the running a pulse sequence and fitting the phase difference image and phase response with different delays to determine coefficients of the second order polynomial and a time constant of the phase response. The method also includes correcting the pre-emphasis eddy current correction system in accordance with the time constant of the phase response, determining an amplitude of correction to reduce the determined coefficients, and storing the determined amplitude corrections in the pre-emphasis eddy current correction system.

In other aspects, the present invention provides a method for measuring and correcting for eddy currents in a magnetic resonance imaging system. The method includes turning at least a portion of a pre-emphasis eddy current correction system of the magnetic resonance imaging system off, running a pulse sequence using bipolar gradient pulses to acquire a phase-difference image and a phase response of a static phantom that fills a majority of a field of view (FOV) of the magnetic resonance imaging system, where running also includes running the pulse sequence to provide a first delay Te, and linearly fitting the phase difference image to a two-dimensional polynomial. The method further includes changing the pulse sequence to provide a different delay, iterating the running a pulse sequence and the fitting the phase difference image and phase response a plurality of times with different said delays to determine coefficients of the polynomial and a time constant of the phase response, and correcting the pre-emphasis eddy current correction system in accordance with the time constant of the phase response. Additionally, the method includes determining an amplitude of correction to reduce the determined coefficients and storing the determined amplitude corrections in the pre-emphasis eddy current correction system.

It will thus be seen that configurations of the present invention provide improved calibration of magnetic imaging systems that will not only benefit clinical applications using phase contrast imaging, but also any other application or sequences that are affected by eddy currents having short time constants.

DETAILED DESCRIPTION OF THE INVENTION

In various configurations, the present invention provides technical effects that include improved calibration of magnetic imaging systems that not only benefit clinical applications using phase contrast imaging as well as other application or sequences that are affected by eddy currents having short time constants.

Figure 1:
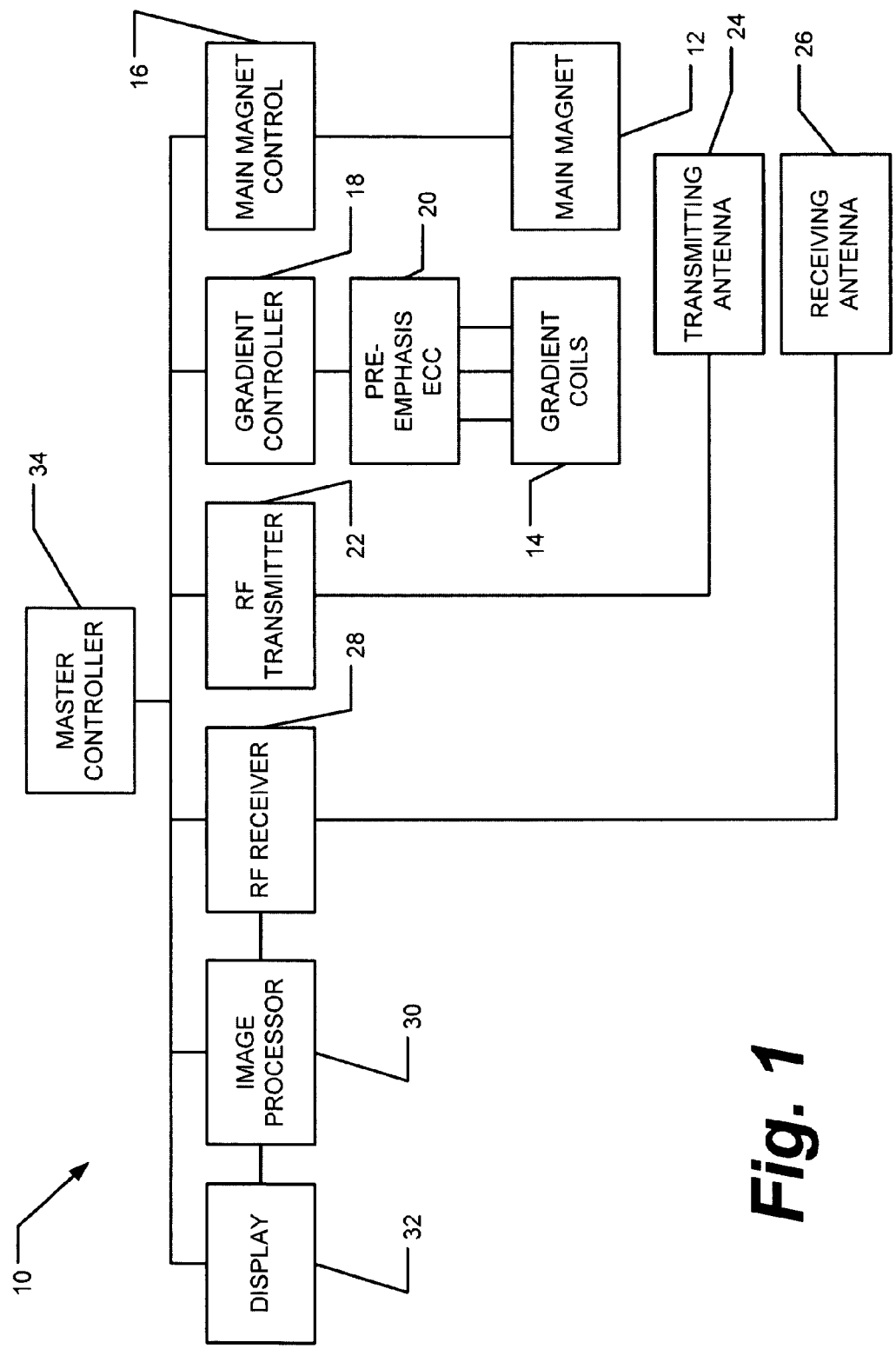
FIG. 1 is a block diagram representative of some configurations of magnetic imaging systems.

In some configurations of the present invention and referring to the block diagram of FIG. 1, a magnetic resonance imaging apparatus 10 includes a main magnet 12 and a set of one or more gradient coils 14. The operation of main magnet 12 is under control of main magnet controller 16. A gradient controller 18 controls the operation of gradient coils 14. Gradient controller 18 produces current pulses to gradient coils 14, thereby producing magnetic field pulses having a pre-selected profile. However, as a result of eddy current fields, the profiles of the magnetic field pulses are distorted relative to the current pulses applied to gradient coils 14. The distortion tends to round off leading corners of the pulses and to lengthen the tail of the pulse. To compensate, a pre-emphasis eddy current correction (ECC) system including a pre-emphasis eddy current correction circuit 20 is provided. Pre-emphasis ECC circuit 20 boosts current at the beginning of the current pulse from gradient controller 18 to provide eddy current compensation.

A radio frequency transmitter 22 is provided to generate various RF pulses. Transmitter 22 is electronically coupled to transmitting antenna 24, which is adjacent an examination area inside magnetic resonance imaging apparatus 10. A receiving antenna 26 receives radio frequency signals from a sample under test (not shown in FIG. 1), for example, free induction decay signals. These signals are received by RF receiver 28. An image processor 30 demodulates and processes the received signals, which may include the production of plots of a free induction decay signal. The images produced by image processor 30 as well as data can be stored in a memory (not shown) of image processor 30 memory located elsewhere in MRI apparatus 10 or displayed on a suitable display 32. The memory may be of any suitable type, including random access memory, magnetic media, optical media, or a network storage device. The memory may be located elsewhere in MRI apparatus 10 or at a network storage device communicating with MRI apparatus 10. Timing and sequencing of MRI apparatus 10 is controlled by a master controller 34.

Phase contrast imaging uses a bipolar gradient from gradient controller 18 to encode flowing spins. For each set of k-space data, there are usually two acquisitions. In a first acquisition, a flow sensitizing bipolar gradient is turned on. In a second acquisition, the bipolar gradient is either turned off or reversed in polarity. The phase difference image reconstructed from these two sets of data is used to represent the flow. It is known that the flow velocity is proportional to the phase difference:

$$v = \frac{v_{enc} \Delta \varphi}{\pi} \quad (1)$$

in which $v_{enc}$ is the velocity which will lead to phase shift of $\pi$.

If pre-emphasis ECC circuit 20 inadequately compensates for eddy current, there will be different amount of extra phase accumulation during the two acquisitions. Thus, a spurious extra phase difference is displayed in the phase difference image because the eddy current effects are different in these two acquisitions. As a result of the spurious phase difference, there is also an error in flow or velocity measurement. These effects can lead to an overall phase shift in an entire object or a phase ramp throughout an object. The overall phase shift, or phase ramp, is caused by B0 eddy currents (DC) and linear eddy currents, respectively. On a scanner with a high slew-rate gradient system used in applications such as the quantification of aortic flow, the amount of error can be on the order of the quantity being measured.

Figure 2:
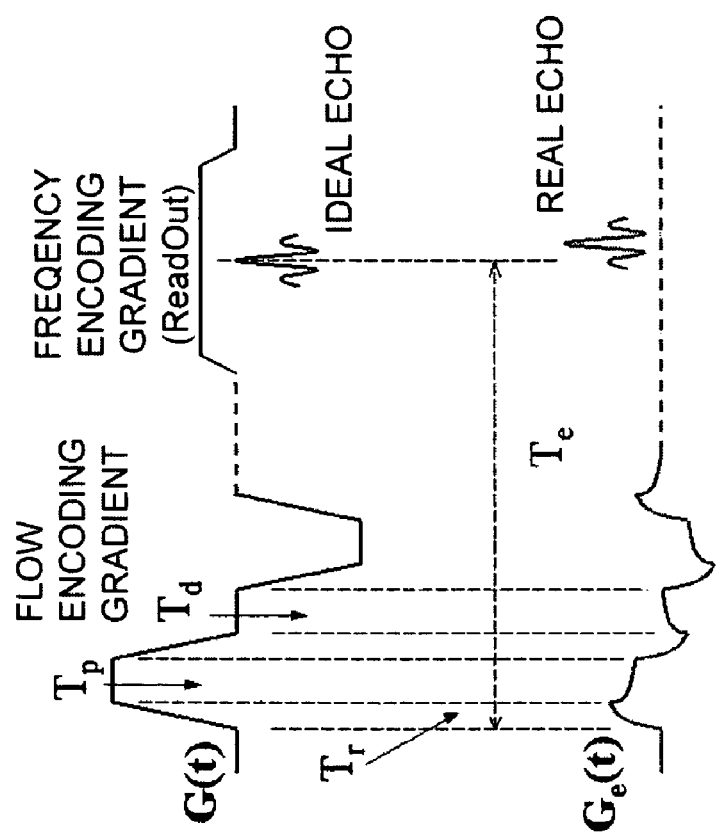
FIG. 2 is a example of a bipolar pulse showing various timing parameters.

More particularly, in a case in which a static ball phantom is used with no net flow or motion, the residual phase image should be zero everywhere. A primary flow encoding gradient G(t) has no effect on the center of an echo, whereas an induced eddy current gradient $G_e(t)$ shifts the center of the echo. This shift will introduce a phase ramp in the final phase image. A DC offset also occurs through the change of the center resonance frequency during the scan. In FIG. 2, $T_r$ is ramp time, $T_p$ is plateau time, $T_d$ is the delay time between two bipolar pulses, and $T_e$ is the time between the start of the bipolar pulse and the center of the ideal echo.

In some configurations of the present invention, eddy current is modeled as an exponentially decaying function, so for eddy current with a specific time constant $\tau$, the induced eddy current gradient $G_e(t)$ is written as the convolution of the changing of the primary gradient G(t) and an exponential function:

$$G_e(t) = A \cdot e^{-\frac{t}{\tau}} \otimes \frac{dG(t)}{dt}, \quad (2a)$$

$$B_e(t) = B \cdot e^{-\frac{t}{\tau}} \otimes \frac{dG(t)}{dt} \quad (2b)$$

in which quantities A and B represent coupling constants (mutual inductance). Equation (2a) represents a linear eddy current instance and equation (2b) represents a B0 eddy current instance.

Figure 3:
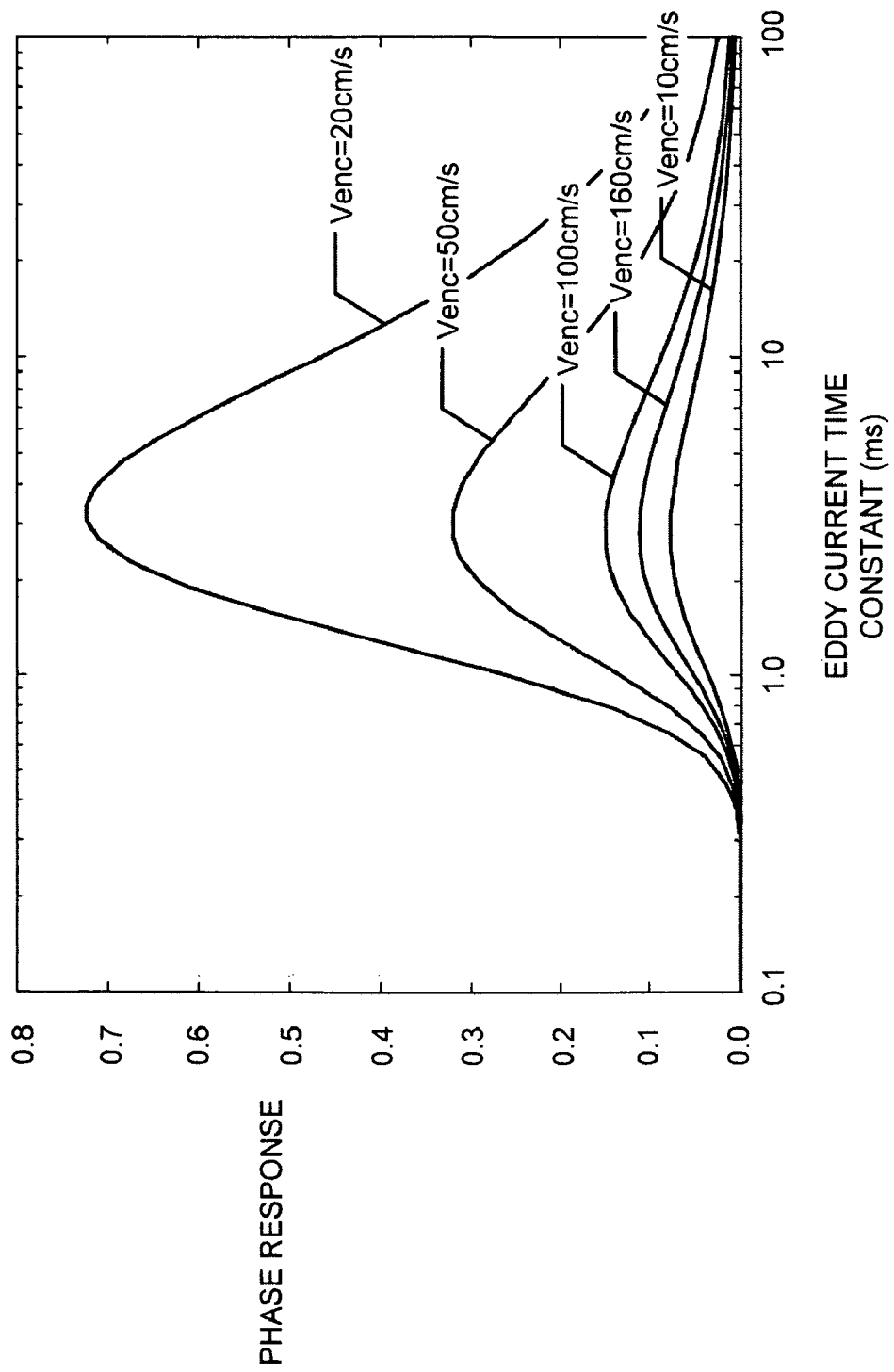
FIG. 3 is a plot of phase change as a function of eddy current time constant.

The phase change caused by $G_e(t)$ is written as:

$$\phi_L(x) \propto \int_0^{T_e} x \cdot G_e(t) dt \quad (3a)$$

$$\phi_0 \propto \int_0^{T_e} B_{0e}(t) dt \quad (3b)$$

wherein equation (3a) represents the linear eddy current instance and equation (3b) represents the B0 eddy current instance. For the bipolar pulse example shown in FIG. 2, this phase shift can be written:

$$\phi_L(x) = A' \cdot x \cdot R \cdot \tau^2 \cdot e^{-\frac{T_e}{\tau}} \cdot \left[1 - e^{\frac{T_e}{\tau}}\right] \cdot \left[1 - e^{-\frac{T_e+T_p}{\tau}}\right] \cdot \left[1 - e^{-\frac{2T_e+T_p+T_d}{\tau}}\right] \quad (4a)$$

$$\phi_0 = B' \cdot R \cdot \tau^2 \cdot e^{-\frac{T_e}{\tau}} \cdot \left[1 - e^{\frac{T_e}{\tau}}\right] \cdot \left[1 - e^{-\frac{T_e+T_p}{\tau}}\right] \cdot \left[1 - e^{-\frac{2T_e+T_p+T_d}{\tau}}\right] \quad (4b)$$

wherein constant R represents the slew-rate and A' and B' include the aforementioned coupling constants A and B respectively, and additional factors. A plot of the phase change as a function of the eddy current time constant is shown in FIG. 3. Timing parameters of the waveform used are listed in Table I, using the same notation utilized in the above description of FIG. 2. More particularly, Table I shows timing parameters and slew rate values (in terms of voltage recorded on an oscilloscope) of exemplary bipolar waveforms used in phase contrast imaging with different Venc values.

TABLE I

|  | Venc = 20 cm/s | Venc = 50 cm/s | Venc = 100 cm/s | Venc = 160 cm/s | Venc = 250 cm/s |
|---|---|---|---|---|---|
| $T_r$(ms) | 0.491 | 0.393 | 0.315 | 0.308 | 0.293 |
| $T_p$(ms) | 0.097 | 0.000 | 0.000 | 0.000 | 0.000 |
| $T_d$(ms) | 0.436 | 0.442 | 0.442 | 0.434 | 0.438 |
| $T_e$(ms) | 4.639 | 4.062 | 3.748 | 3.711 | 3.657 |
| R (V/ms) | 14.88 | 13.89 | 11.05 | 8.74 | 6.79 |

Peak phase response occurs when the eddy current time constant approaches the $T_e$ value (3~4 ms), where measurements for the eddy current time constant and amplitude are least accurate and reliable with the available Eddy current compensation (ECC) method. Therefore, some configurations of the present invention use equation (4) within a pre-emphasis ECC framework.

In particular, some configurations of the present invention measure eddy current having a short time constant and use pre-emphasis ECC circuit 20 to correct for the short time constant eddy current. (The eddy current measurement utilizes, for example, RF transmitter 22, transmitting antenna 24, receiving antenna 26, RF receiver 28, and processor 30). Thus, various configurations of the present invention turn off short time constant pre-emphasis ECC coefficients in pre-emphasis ECC circuit 20 so an original system level eddy current is fully exposed. Next, gradient controller 18 is operated to run a phase-contrast sequence using bipolar gradients and utilizing an alternating polarity and a phase difference image of a static phantom that fills a majority of the field of view of MRI apparatus 10. After acquiring the phase image data, the phase image is fit to this data utilizing, for example, processor 30. (Any other suitable processor in or outside of MRI apparatus 10 can also be used.) The fit is performed, for example, to a 2-dimensional second order polynomial written:

$$\phi(x,y) = a + b \cdot x + c \cdot y + d \cdot x^2 + e \cdot y^2 + f \cdot x \cdot y \quad (5)$$

Axes x and y correspond to the two dimensions of the acquired images, and in some configurations are linked to different physical gradient axes dependent upon a selected imaging plane and flow direction. Notably, a substantial second order effect results from under-corrected Maxwell terms, or is induced by higher order eddy current currents. Therefore, various configurations of the present invention utilize a least squares fit to at least second order to cleanly separate out DC terms a and linear terms b and c. In some configurations, a linear fit is used.

From equation (4) we notice that for a given set of bipolar gradients, i.e. the same $T_r$, $T_p$, $T_d$, and R, the phase response has a simple dependency on $T_e$:

$$\phi(T_e) = \alpha \cdot e^{\frac{T_e}{\tau}} \quad (6)$$

where the parameter $\alpha$ includes all non-$T_e$ dependent quantities. In some configurations of the present invention, this dependency, which reflects the eddy current time constant $\tau$, is determined by varying $T_e$ or sliding a read-out window to a different position. The quantity $\phi(T_e)$ has a direct association with the quantities a, b, and c, depending on the type of eddy current that is being determined.

Typical scanner systems have eddy currents of various time constants that have different coupling strength. However, in many configurations, a small window of 1–20 ms contains the eddy currents that affect phase contrast imaging, so some configurations of the present invention measure only one predominant time constant. To take into account eddy currents outside of this window, equation (6) would have to be modified, but should still be solvable by multiple exponential fits.

Figure 4:
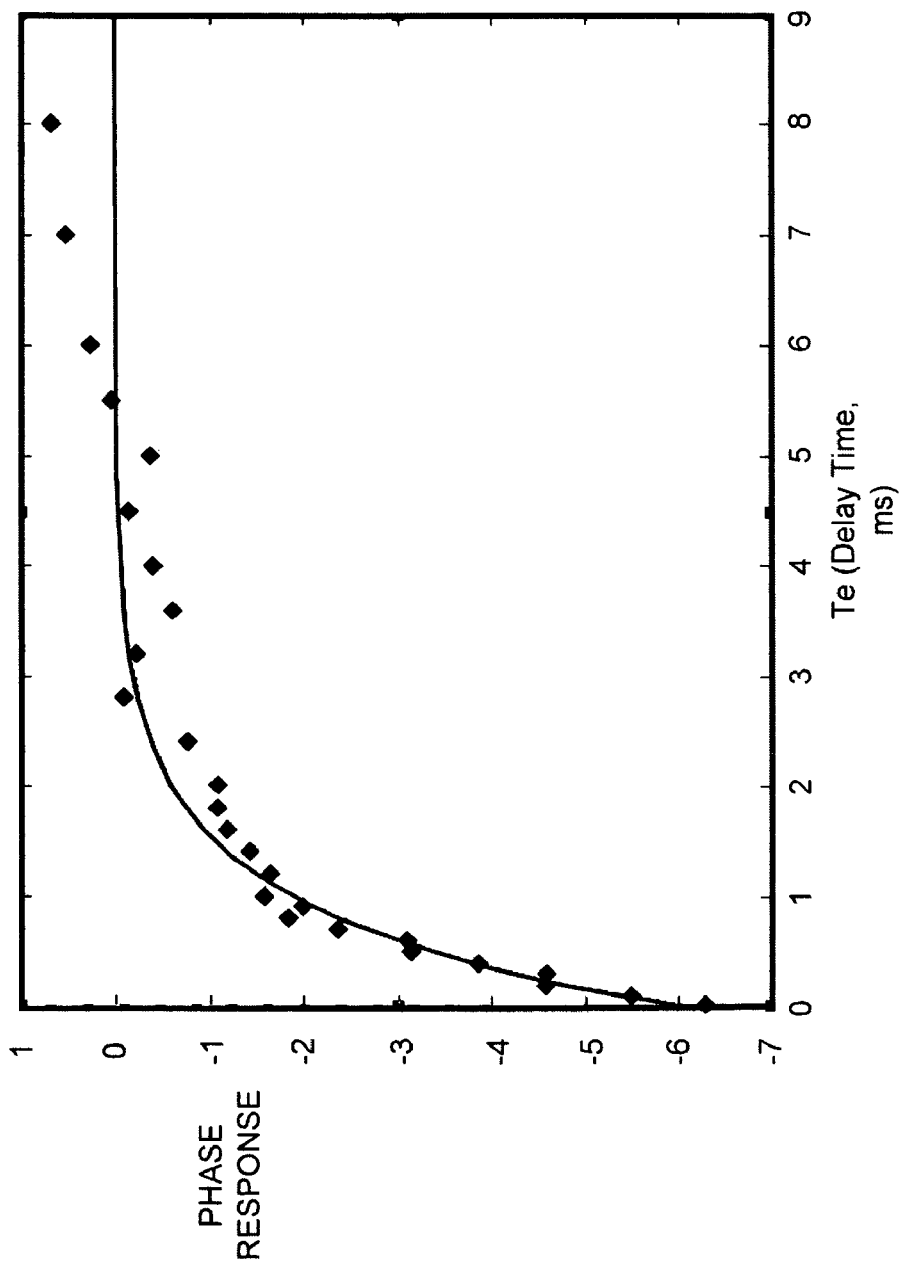
FIG. 4 shows results of an experiment demonstrating the performance of a configuration of the present invention as a plot of phase response vs. $T_e$, the delay time.

FIG. 4 shows the results of an experiment that demonstrates the performance of a configuration of the present invention.

Figure 5:
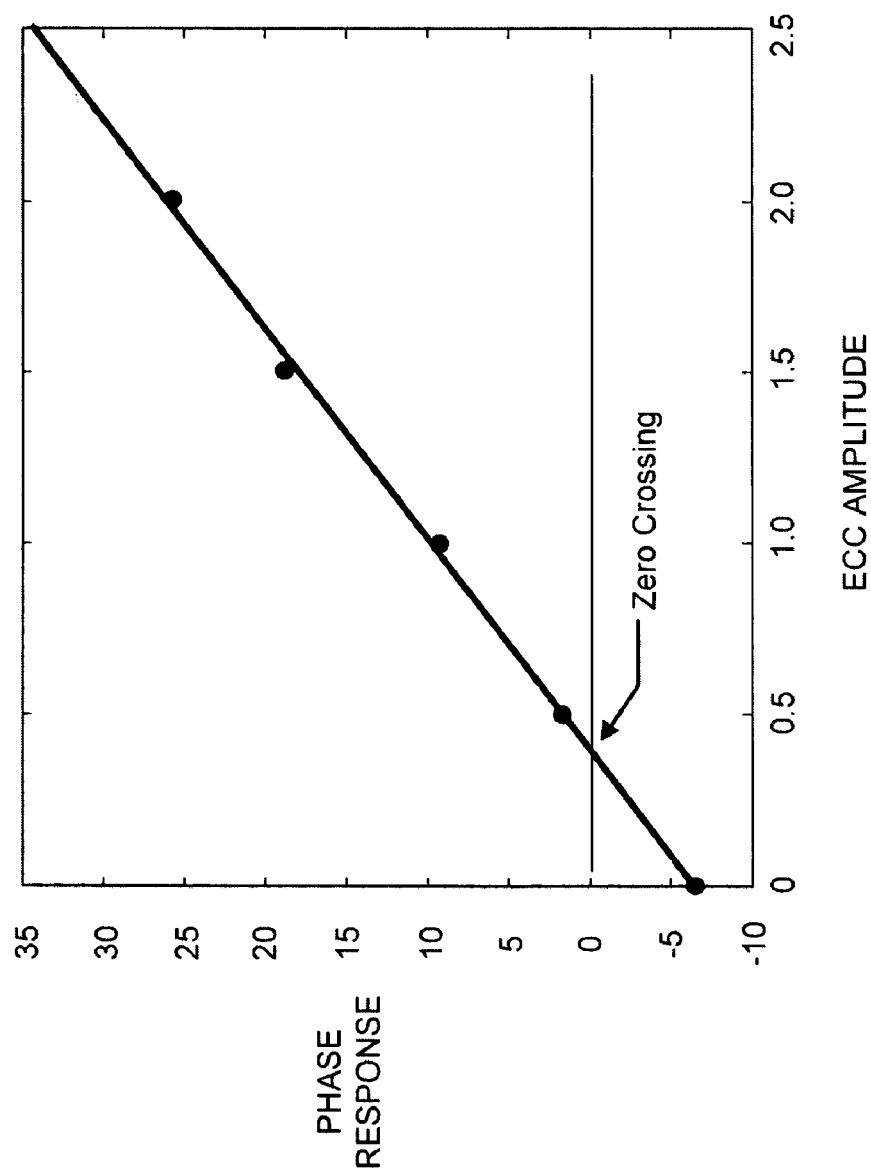
FIG. 5 is a graph illustrating how a correction amplitude, can be determined from a limited number of measurements made by varying an amplitude of a pre-emphasis eddy current correction system.

After determining the time constant $\tau$, various configurations of the present invention measure a corresponding amplitude of the eddy current. To do so, advantage is taken of the fact that either an over-compensated or an undercompensated system produces net phase. Thus, in some configurations, the already measured time constant is put back into the pre-emphasis ECC system, and an attempt is made to determine an appropriate amplitude by varying the amplitude used by the pre-emphasis ECC system. Experiments have shown that three points of measurement are adequate to determine the right amplitude. FIG. 5 shows a set of results demonstrating the usefulness of this technique. The results were obtained using one set of bipolar gradients (Tr, Tp, Td, and R), but are independent of the particular waveform being tested.

In some configurations of the present invention, similar tests are used to determine 12 coefficients for a typical scanner system, 3 for short time constant B0 eddy currents, 3 for on-axis linear eddy currents, and 6 for off-axis (cross term) linear eddy currents. This determination is made in some configurations using combinations of different imaging planes and applying bipolar gradients on different axes. The resulting improved calibration will not only benefit clinical applications using phase contrast imaging, but will also benefit other applications/sequences that are affected by the eddy current of short time constants.

In some configurations, the zero-crossing term used corresponds to an ECC amplitude of 0.395 (0.395% of the maximum original gradient strength). This ECC amplitude corresponds to an amount of correction needed in the pre-emphasis ECC system to suppress the background phase.

Figure 6:
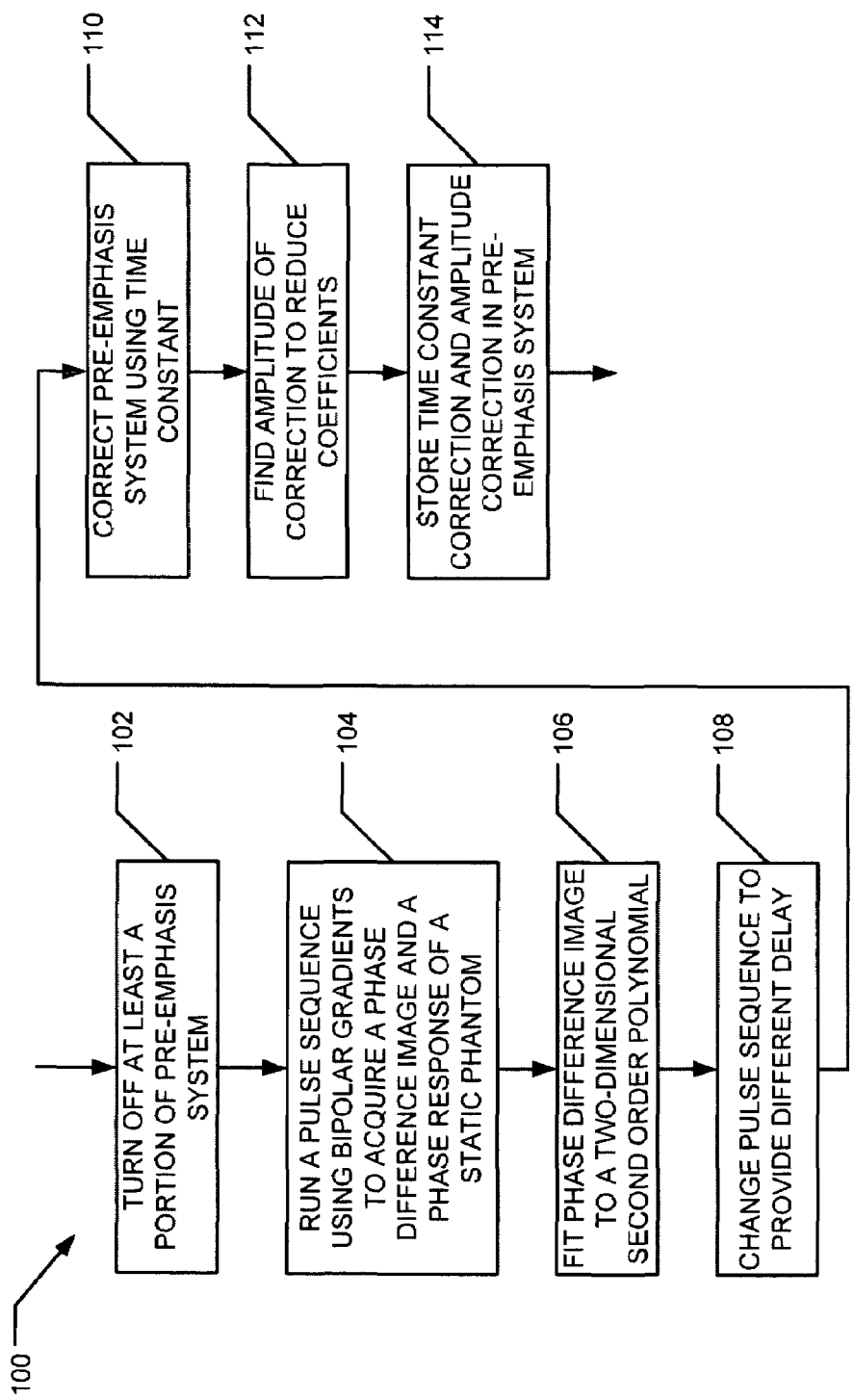
FIG. 6 is a flow chart representative of various configurations of the present invention.

Thus, in some configurations of the present invention and referring to flow chart 100 of FIG. 6, a technical effect of the present invention is achieved by a user or technician turning off at least a portion of a pre-emphasis ECC system of a magnetic imaging system at 102. For a pre-emphasis ECC system that provides compensation for both short time constant and long time constant pre-emphasis, the portion turned off is, for example, the portion that provides compensation for short time constant pre-emphasis. In some configurations, the portion turned off includes time constants between about 1 and 20 ms. A pulse sequence is run at 104 using bipolar gradient pulses to acquire a phase-difference image and a phase response of a static phantom that fills a majority of a field of view (FOV) of the magnetic resonance imaging system, where running also includes running the pulse sequence to provide a first delay Te. For example, the pulse sequence is run using a static ball phantom, for which a residual phase image should be zero everywhere. The phase difference image can be in an axial plane, a saggittal plane, or a coronal plane. The phase difference image is fitted to a two-dimensional second order polynomial at 106. For example, the phase difference image is fitted to eq. (5) above. Some configurations fit coefficients a, b, c, d, e, and f, but fit coefficients d, e, and f only to more accurately determine coefficients a, b, and c. Coefficients d, e, and f are discarded or not used thereafter. In some configurations, the phase difference image is linearly fitted to a two dimensional polynomial. Whether a linear fit or another type of fit is performed, the pulse sequence is then changed at 108 to provide a different delay Te, and steps 104 and 106 are iterated with different delays (step 108 is repeated as necessary to provide the different delays) until sufficient information is obtained to determine coefficients of the second order polynomial (namely, coefficients a, b, and c) and to determine a time constant of the phase response. The pre-emphasis ECC system is then corrected in accordance with the determined time constant at 110, and an amplitude of correction is found to reduce the determined coefficients at 112. In some configurations, step 112 comprises utilizing exactly three points of measurement with different amplitudes to determine the appropriate amplitude of correction, although fewer points measurements suffice in some cases and more can be used if desired for a better determination. The amplitude corrections are stored in the pre-emphasis ECC system of the magnetic resonance imaging system at 114. ("Storing in the pre-emphasis ECC system of the magnetic resonance imaging system" is intended to encompass storage of the amplitude corrections anywhere in the imaging system in which the stored amplitude corrections can be used by the pre-emphasis ECC system.) Some configurations of the present invention represented by flow chart 100 repeat the process represented therein for each of three pairs of axes (x,y), (y,z), and (x,z). Also, some configurations carry out the process three times for short time constant B0 eddy currents, three times for on-axis linear eddy currents, and six times for the off-axis (cross-term) linear eddy currents by using combinations of different imaging planes and applying bipolar gradients on different axes. In practice, nine sets of tests have been found sufficient to determine all coefficients, and thus only nine sets of tests are performed in some configurations.

It will be appreciated that configurations of the present invention provide improved calibration of magnetic imaging systems that will not only benefit clinical applications using phase contrast imaging, but also any other application or sequences that are affected by eddy currents having short time constants.

While the invention has been described in terms of various specific embodiments, those skilled in the art will recognize that the invention can be practiced with modification within the spirit and scope of the claims.

What is claimed is:

1. A method for measuring and correcting for eddy currents in a magnetic resonance imaging system, said method comprising:
    turning at least a portion of a pre-emphasis eddy current correction system of the magnetic resonance imaging system off;
    running a pulse sequence using bipolar gradient pulses to acquire a phase-difference image and a phase response of a static phantom that fills a majority of a field of view (FOV) of the magnetic resonance imaging system, wherein said running also comprises running the pulse sequence to provide a first delay Te;
    fitting the phase difference image to a two-dimensional second order polynomial;
    changing the pulse sequence to provide a second delay different than the first delay Te;
    iterating said running a pulse sequence and fitting the phase difference image and phase response a plurality of times with a plurality of different delays to determine coefficients of the second order polynomial and a time constant of the phase response;
    correcting the pre-emphasis eddy current correction system in accordance with the time constant of the phase response;
    determining an amplitude of correction to reduce the determined coefficients; and
    storing the determined amplitude corrections in the pre-emphasis eddy current correction system.

2. A method in accordance with claim 1 wherein said phase difference image is an axial plane image.

3. A method in accordance with claim 1 wherein said phase difference image is a saggittal plane image.

4. A method in accordance with claim 1 wherein said phase difference image is a coronal plane image.

5. A method in accordance with claim 1 wherein said turning at least a portion of a pre-emphasis eddy current correction system off comprises turning off short time constant pre-emphasis.

6. A method in accordance with claim 5 wherein said short time constant pre-emphasis includes time constants between about 1 and 20 ms.

7. A method in accordance with claim 1 wherein said fitting the phase difference image to a two dimensional second order polynomial comprises fitting a phase image $\phi(x,y)$ to a polynomial written:

$$\phi(x,y)=a+b\cdot x+c\cdot y+d\cdot x^2+e\cdot y^2+f\cdot x\cdot y,$$

wherein x and y correspond to two dimensions of the acquired image, and a, b, c, d, e, and f are coefficients to be fitted.

8. A method in accordance with claim 7 wherein coefficients d, e, and f are fitted to more accurately determine a, b, and c, and discarded or not used thereafter.

9. A method in accordance with claim 8 wherein changing the pulse sequence to provide the second delay comprises varying at least one of ramp time, plateau time, or delay time between two bipolar pulses to effect a different delay $T_e$.

10. A method in accordance with claim 9 wherein said acquiring a phase response comprises acquiring and fitting a phase response written:

$$\phi(T_e) = \alpha \cdot e^{-\frac{T_e}{\tau}},$$

where $\alpha$ includes all non-$T_e$ dependent quantities.

11. A method in accordance with claim 1 repeated for each of three pairs of axes.

12. A method in accordance with claim 1 wherein the static phantom is a static ball phantom.

13. A method in accordance with claim 1 wherein said determining an amplitude of correction to reduce the determined coefficients; comprises utilizing exactly three different amplitudes to determine an amplitude of correction needed in the pre-emphasis eddy current correction system to suppress a background phase.

14. A method in accordance with claim 1 performed three times for short time constant B0 eddy currents, three times for on-axis linear eddy currents, and six times for off-axis (cross term) linear eddy currents.

15. A method in accordance with claim 1 performed nine times to determine said coefficients.

16. A method for measuring and correcting for eddy currents in a magnetic resonance imaging system, said method comprising:

turning off short time constant pre-emphasis corrections within a pre-emphasis eddy current correction system of the magnetic resonance imaging system, including time constants between 1 and 20 ms;

running a pulse sequence using bipolar gradient pulses to acquire a phase-difference image and a phase response of a static phantom that fills a majority of a field of view (FOV) of the magnetic resonance imaging system, wherein said running also comprises running the pulse sequence to provide a first delay Te;

fitting the phase difference image to a two dimensional second order polynomial $\phi(x,y)$ written:

$$\phi(x,y)=a+b\cdot x+c\cdot y+d\cdot x^2+e\cdot y^2+f\cdot x\cdot y,$$

wherein x and y correspond to two dimensions of the acquired image, and a, b, c, d, e, and f are coefficients to be fitted;

changing the pulse sequence to provide a second delay different than the first delay Te;

iterating said running a pulse sequence and fitting the phase difference image and phase response with a plurality of different delays to determine coefficients of the second order polynomial and a time constant of the phase response;

correcting the pre-emphasis eddy current correction system in accordance with the time constant of the phase response;

determining an amplitude of correction to reduce the determined coefficients; and storing the determined amplitude corrections in the pre-emphasis eddy current correction system.

17. A method in accordance with claim 16 wherein coefficients d, e, and f are fitted to more accurately determine a, b, and c, and discarded thereafter.

18. A method in accordance with claim 17 wherein changing the pulse sequence to provide the second delay comprises varying at least one of ramp time, plateau time, or delay time between two bipolar pulses to effect a different delay $T_e$.

19. A method in accordance with claim 18 wherein said acquiring a phase response comprises acquiring and fitting a phase response written:

$$\phi(T_e) = \alpha \cdot e^{-\frac{T_e}{\tau}},$$

where $\alpha$ includes all non-$T_e$ dependent quantities.

20. A method in accordance with claim 16 repeated for each pair of axes (x,y), (y,z), and (x,z).

21. A method in accordance with claim 16 wherein the static phantom is a static ball phantom.

22. A method in accordance with claim 16 wherein said determining an amplitude of correction to reduce the determined coefficients comprises utilizing exactly three different amplitudes to determine an amplitude of correction needed in the pre-emphasis eddy current correction system to suppress a background phase.

23. A method for measuring and correcting for eddy currents in a magnetic resonance imaging system, said method comprising:

running a pulse sequence using bipolar gradient pulses to acquire a phase-difference image and a phase response of a static phantom that fills a majority of a field of view (FOV) of the magnetic resonance imaging system, wherein said running also comprises running the pulse sequence to provide a first delay Te;

fitting the phase difference image to a two-dimensional second order polynomial;

changing the pulse sequence to provide a second delay different than the first delay Te;

iterating said running a pulse sequence and fitting the phase difference image and phase response with a plurality of different delays to determine coefficients of the second order polynomial and a time constant of the phase response;

correcting a pre-emphasis eddy current correction system of the magnetic resonance imaging system in accordance with the time constant of the phase response;

determining an amplitude of correction to reduce the determined coefficients; and storing the determined amplitude corrections in the pre-emphasis eddy current correction system.

24. A method for measuring and correcting for eddy currents in a magnetic resonance imaging system, said method comprising:

turning at least a portion of a pre-emphasis eddy current correction system of the magnetic resonance imaging system off;

running a pulse sequence using bipolar gradient pulses to acquire a phase-difference image and a phase response of a static phantom that fills a majority of a field of view (FOV) of the magnetic resonance imaging system, wherein said running also comprises running the pulse sequence to provide a first delay Te;

linearly fitting the phase difference image to a two-dimensional polynomial;

changing the pulse sequence to provide a second delay different than the first delay Te;

iterating said running a pulse sequence and fitting the phase difference image and phase response a plurality of times with a plurality of different delays to determine coefficients of the second order polynomial and a time constant of the phase response;

correcting the pre-emphasis eddy current correction system in accordance with the time constant of the phase response;

determining an amplitude of correction to reduce the determined coefficients; and storing the determined amplitude corrections in the pre-emphasis eddy current correction system.

* * * * *

UNITED STATES PATENT AND TRADEMARK OFFICE
CERTIFICATE OF CORRECTION

PATENT NO. : 7,112,964 B2  Page 1 of 1
APPLICATION NO. : 10/909447
DATED : September 26, 2006
INVENTOR(S) : Zhou et al.

It is certified that error appears in the above-identified patent and that said Letters Patent is hereby corrected as shown below:

Column 12, line 6, delete "coefficients of the second order polynomial" and insert therefor -- coefficients of the polynomial --.

Signed and Sealed this

Fourth Day of March, 2008

JON W. DUDAS
*Director of the United States Patent and Trademark Office*